(12) United States Patent
Mikami et al.

(10) Patent No.: US 7,771,626 B2
(45) Date of Patent: Aug. 10, 2010

(54) METAL OXYNITRIDE MATERIAL WITH A SUPERIOR THERMOELECTRIC PROPERTY

(75) Inventors: Masashi Mikami, Aichi (JP); Kimihiro Ozaki, Aichi (JP); Keizo Kobayashi, Aichi (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 11/773,104

(22) Filed: Jul. 3, 2007

(65) Prior Publication Data

US 2008/0121849 A1    May 29, 2008

(30) Foreign Application Priority Data

Jul. 3, 2006    (JP) .............................. 2006-183095

(51) Int. Cl.
  *H01B 1/02*    (2006.01)
  *H01L 35/14*   (2006.01)

(52) U.S. Cl. ............... 252/519.1; 136/239; 136/240; 252/519.12; 252/519.14; 252/519.15

(58) Field of Classification Search ........... 252/500, 252/520.2, 520.21, 520.22
See application file for complete search history.

(56) References Cited

U.S. PATENT DOCUMENTS

2003/0216252 A1 * 11/2003 Gole .................... 502/200

FOREIGN PATENT DOCUMENTS

| JP | 3069701 | 5/2000 |
|----|---------|--------|
| JP | 2005-276959 | 10/2005 |
| JP | 2006-100683 | 4/2006 |

* cited by examiner

*Primary Examiner*—Milton I Cano
*Assistant Examiner*—Thuy-Ai N Nguyen
(74) *Attorney, Agent, or Firm*—Oblon, Spivak, McClelland, Maier & Neustadt, L.L.P.

(57) ABSTRACT

The invention provides a novel n-type thermoelectric conversion material which comprises low-toxic and abundant elements, and has excellent heat-resistance, chemical durability and the like, as well as high thermoelectric conversion efficiency, the thermoelectric conversion material comprises a metal oxynitride thermoelectric conversion material which has a composition represented by formula $Ti_{1-x}A_xO_yN_z$ (wherein A is at least one element selected from the group consisting of transition metals of the 4th and 5th periods of the periodic table, and $0 \leq x \leq 0.5$, $0.5 \leq y \leq 2.0$, $0.01 \leq z \leq 0.6$), and has an absolute value of thermoelectric power of at least 30 μV/K at 500° C. or above, and a novel n-type thermoelectric conversion material, a thermoelectric conversion element and a thermoelectric conversion module comprising the above metal oxynitride can also be provided.

7 Claims, 6 Drawing Sheets

METAL OXYNITRIDE MATERIAL WITH A SUPERIOR THERMOELECTRIC PROPERTY

BACKGROUND OF THE INVENTION

1. Field of the Invention

The present invention relates to a thermoelectric conversion material comprising a metal oxynitride, and more particularly, to a metal oxynitride having superior characteristics as an n-type thermoelectric conversion material, and to an n-type thermoelectric conversion material, a thermoelectric conversion element, and a thermoelectric power generating module comprising such metal oxynitride.

2. Description of the Related Art

In this country, the effective energy yield from primary supply energy is merely of about 30%, with about 70% of that energy being dissipated into the atmosphere as heat. Also, most of the heat generated as a result of combustion in factories, waste incineration plants and the like is dissipated into the atmosphere without being converted into some other energy. Mankind wastes thus thermal energy in a huge scale while extracting only a small amount of energy from activities such as burning of non-renewable petroleum fuels.

In order to increase energy yields, this thermal energy wasted into the atmosphere must be exploited somehow. Thermoelectric conversion, in which thermal energy is converted directly into electrical energy, is an effective means for attaining that goal. Thermoelectric conversion is an energy conversion method based on the Seebeck effect, wherein electricity is generated through thermoelectric power that arises as a result of a temperature difference between two ends of a thermoelectric conversion material.

In thermoelectric generation, power can be obtained, for instance, by simply arranging the end of a thermoelectric conversion material at a high-temperature portion warmed through waste heat, arranging the other end of the thermoelectric conversion material in the atmosphere (room temperature portion), and connecting both ends with a conductive wire. That is, mobile components such as motors, turbines or the like are unnecessary in an ordinary thermoelectric device. As a result, the thermoelectric conversion material can generate power continuously in inexpensive equipment, without exhaust gases resulting from combustion or the like, until the material deteriorates.

In light of these advantages, thermoelectric power generation holds promise as a technology that can contribute to tackling the grave problem of energy resource demand in the foreseeable future. In order to realize thermoelectric generation for universal situations, however, it will be necessary to supply large amounts of thermoelectric conversion materials having superior characteristics such as high thermoelectric conversion efficiency, heat resistance, chemical durability and the like.

Substances currently known to have high thermoelectric conversion efficiencies include intermetallic compounds. The thermoelectric conversion efficiency of intermetallic compounds, which can be used in the atmosphere only at temperatures not exceeding 300° C., is at most of about 10%. Also, thermoelectric conversion materials comprising intermetallic compounds contain often toxic elements and/or rare earth elements, among their constituent elements. This makes the use of such thermoelectric conversion materials in all-purpose applications difficult, in terms of safety and/or power generation costs.

For these reasons, thermoelectric conversion exploiting waste heat has not been realized thus far. It would thus be highly desirable to develop a material that should have high thermoelectric conversion efficiency, little toxicity, be composed of abundant elements and possess excellent heat-resistance, chemical durability and the like.

In recent years, Co-based complex oxides containing Ca, Bi and the like as "complex oxides having a high Seebeck coefficient and high electric conductivity" have been reported as materials having high thermoelectric conversion efficiency (Japanese Patent No. 3069701). In addition to exhibiting excellent thermoelectric characteristics, these complex oxides are composed of abundant elements, while exhibiting superior heat-resistance and chemical durability, and hence are expected to afford materials that are easy to realize.

Such Co-based complex oxides, however, have a p-type electric characteristic, and do not exhibit n-type characteristics. Both p-type and n-type thermoelectric materials are ordinarily required for building up a thermoelectric conversion element. That is because the efficiency of power generation obtained by combining a p-type material that generates negative thermoelectric power on a high-temperature side, and an n-type material that generates positive thermoelectric power on an opposite high-temperature side, more than doubles the generation efficiency achieved using exclusively a p-type or an n-type material. It is thus necessary to develop a material having high n-type thermoelectric conversion efficiency, as well as superior heat-resistance and chemical durability.

Ordinary examples of materials having excellent heat-resistance and chemical durability include oxides of transition metals and the like. Among such oxides, n-type thermoelectric conversion materials that have been studied include, for instance, $TiO_x$ "titanium oxide thermoelectric conversion materials" (wherein $1.89 \leq x < 1.94$, $1.94 < x < 2$) and $Ti_xM_yO_2$ "thermoelectric conversion material, thermoelectric conversion element and thermoelectric generator element using the same" (wherein M is at least one selected among Ta, Nb and V, and $0.78 \leq x \leq 1.0$, $0.005 \leq y \leq 0.18$, $0.01 < y/x$) (Japanese Laid-open Patent Application Nos. 2006-100683 and 2005-276959). However, a composition comprising N has not been studied yet.

SUMMARY OF THE INVENTION

Under such circumstances and in the light of the above conventional technologies, the inventors perfected the present invention, as a result of diligent research on new thermoelectric conversion materials, upon finding out that a metal oxynitride having a specific composition comprising Ti, O and N, as well as a metal oxynitride in which part of the elements is replaced by another element, have simultaneously high thermoelectric power, good electric conductivity and low thermal conductivity, and possess high thermoelectric conversion efficiency that can be suitably exploited in the form of a thermoelectric conversion material.

Specifically, an object of the invention is to provide a novel thermoelectric conversion material having high n-type thermoelectric conversion efficiency, comprising low-toxic and abundant elements, and having excellent heat-resistance, chemical durability and the like. Another object of the invention is to provide a metal oxynitride having a composition represented by the formula below, an n-type thermoelectric conversion material, a thermoelectric conversion element, and a thermoelectric power generating module.

In order to solve the above problems, the present invention encompasses the following technical means:

(1) A thermoelectric conversion material, comprising: a metal oxynitride having a composition represented by formula $Ti_{1-x}A_xO_yN_z$ (wherein A is at least one element selected from the group consisting of transition metals of the 4th and 5th periods of the periodic table, and $0 \leq x \leq 0.5$, $0.5 \leq y \leq 2.0$, $0.01 \leq z \leq 0.6$), and having other inevitable elements.

(2) The thermoelectric conversion material according to (1), wherein A in the above formula is at least one element selected from the group consisting of V, Cr, Mn, Fe, Co, Ni, Zr and Nb.

(3) The thermoelectric conversion material according to (1) or (2), having an absolute value of thermoelectric power of at least 30 µV/K at 500° C. or above.

(4) The thermoelectric conversion material according to (1) or (2), having an electric resistivity of 10 mΩ·cm or less at 500° C. or above.

(5) The thermoelectric conversion material according to (1) or (2), having a thermal conductivity of 10 W/mK or less at 500° C. or above.

(6) The thermoelectric conversion material according to any of (1) to (5), wherein the metal oxynitride is a polycrystal.

(7) The thermoelectric conversion material according to any of (1) to (6), wherein the thermoelectric conversion material is an n-type thermoelectric conversion material.

(8) A thermoelectric conversion element or a thermoelectric conversion module, comprising the n-type thermoelectric conversion material according to (7).

The present invention is explained in detail next.

The metal oxynitride that makes up the thermoelectric conversion material of the present invention has a composition represented by the formula $Ti_{1-x}A_xO_yN_z$. In the formula, A is at least one element selected from the group consisting of transition metals of the 4th and 5th periods of the periodic table. In particular, A is preferably at least one element selected from the group consisting of V, Cr, Mn, Fe, Co, Ni, Zr and Nb, which are close to Ti in the periodic table.

In the formula, the value of x is $0 \leq x \leq 0.5$. If x exceeds 0.5, there precipitates an impurity phase that influences the thermoelectric characteristics, and which precludes obtaining a substance that elicits a sufficient thermoelectric effect. The value of y is $0.5 \leq y \leq 2.0$; if y exceeds 2.0, a stable substance cannot be obtained, whereas when y is lower than 0.5, thermoelectric power drops dramatically, thereby precluding obtaining a substance that elicits a sufficient thermoelectric effect. The value of y is preferably $1.5 \leq y \leq 1.9$, as this affords a substance having a high thermoelectric effect and combining simultaneously a large thermoelectric power with low electric resistivity.

The value of z is $0.01 \leq z \leq 0.6$; if z is lower than 0.01, electric resistivity increases dramatically, thereby precluding obtaining a substance that elicits a sufficient thermoelectric effect. When z exceeds 0.6, thermoelectric power drops dramatically, thereby precluding obtaining a substance that elicits a sufficient thermoelectric effect. The value of z is preferably $0.1 \leq z \leq 0.5$, as this affords a substance having a high thermoelectric effect and combining simultaneously a large thermoelectric power with low electric resistivity.

When the value of x is greater than 0 in the above formula, the component A becomes an essential component. Herein, suitably adjusting the type and amount of the component allows enhancing thermoelectric power and/or reducing electric resistivity and thermal conductivity more than would be the case for a metal oxynitride where x=0, affording thus a highly useful thermoelectric conversion material.

The metal oxynitride represented by the above formula has negative thermoelectric power. When a temperature difference occurs between two ends of a material comprising such a metal oxynitride, the potential generated as a result of the thermoelectric power is higher in the high-temperature side than in the low-temperature side, the material exhibiting thus the characteristic of an n-type thermoelectric conversion material. Specifically, the metal oxynitride exhibits a negative thermoelectric power at high temperatures, for instance an absolute value of thermoelectric power, at 500° C., of 30 µV/K or more. At higher temperatures, the absolute value of the thermoelectric power tends to increase along with the rise in temperature.

The metal oxynitride has good electric conductivity, exhibiting a low electric resistivity, of 10 mΩ·cm or less, at 500° C. At higher temperatures, electric resistivity tends to increase along with the rise in temperature, but in some cases the same low electric resistivity can be maintained. Furthermore, bringing into contact a material comprising the metal oxynitride and having a low thermal conductivity with a heat source for imparting a temperature difference allows curbing ineffectual outflows of thermal energy, while achieving high-efficiency conversion into electric power. Specifically, the thermal conductivity of the metal oxynitride has a low value, of 10 W/mK or less, at 500° C. At higher temperatures, thermal conductivity tends to increase along with the rise in temperature, but in some cases the same low thermal conductivity can be maintained.

The metal oxynitride of the present invention can be manufactured, for instance, by mixing and sintering raw-material substances to an element component ratio identical to the element component ratio of the target metal oxynitride. The raw-material substances that can be used are not particularly limited, provided that they allow forming a metal oxynitride through sintering, and include, for instance, elemental substances, oxides, nitrides and the like. As a Ti source, for instance, there can be used titanium (Ti), titanium monoxide (TiO), dititanium trioxide ($Ti_2O_3$), titanium dioxide ($TiO_2$), titanium nitride (TiN) and the like. The same applies to other transition elements, where elemental substances, oxides, nitrides and the like can be used. Herein can also be used compounds comprising two or more constituent elements of the metal oxynitride of the invention. The above-described raw-material substances may be used as a single substance of a respective element source, or as mixture of two or more thereof.

O and N can be supplied by using as a raw material an oxide and/or nitride of a transition element such as titanium oxide ($TiO_2$), titanium nitride (TiN) or the like. O and N can also be supplied through thermal treatment in an atmospheric gas comprising O and/or N. For instance, oxygen gas, ozone or the like can be used as the O source. Nitrogen gas, ammonia gas or the like can be used as the N source. These atmospheric gases can be used singly or in mixtures of two or more, and can be used also in mixtures with an inert gas such as helium gas, argon gas and the like.

The sintering temperature and the sintering time are not particularly limited, provided that they allow forming the target metal oxynitride, and may involve, for instance, sintering for 1 minute to 20 hours, at a sintering temperature of about 800° C. to about 1600° C. Sintering means that can be used herein are not particularly limited, and may include arbitrary means such as electric heating furnaces, gas heating furnaces and the like.

Among the metal oxynitrides that constitute the thermoelectric conversion material of the present invention, Table 1 displays the compositional analysis results of metal oxynitrides obtained in the below-described Examples 1 through 6. In all cases the composition comprises Ti, O and N. Also, the metal oxynitrides that constitute the thermoelectric conversion material of the present invention contain a small amount of inevitable elements in the form of impurities contained in the raw material substances and contaminants introduced over the various preparation processes such as mixing, sintering and the like. These components, however, do not affect the thermoelectric characteristics.

The above thermoelectric conversion material comprising a metal oxynitride according to the present invention has a negative thermoelectric power, and exhibits, at 500° C. or above, an absolute value of thermoelectric power of at least 30 μV/K, a low electric resistivity of 10 mΩ·cm or less and a low thermal conductivity of 10 W/mK or less, and hence is an n-type thermoelectric conversion material capable of displaying a superior thermoelectric performance. The metal oxynitride, moreover, has good heat-resistance, chemical durability and the like, comprises low-toxic elements, and is highly practicable as a thermoelectric conversion material.

By exploiting the above characteristics, the metal oxynitride that constitutes the thermoelectric conversion material of the present invention can be effectively employed as an n-type thermoelectric conversion material used at high temperatures. FIG. 1 illustrates a schematic diagram of an example of a thermoelectric power generating module using the thermoelectric conversion material comprising the metal oxynitride according to the present invention as an n-type thermoelectric element. The structure of the thermoelectric power generating module, which is identical to that of known thermoelectric power generating modules, comprises for instance a high-temperature portion substrate, a low-temperature portion substrate, a p-type thermoelectric conversion material, an n-type thermoelectric conversion material, electrodes and conducting wires. Herein, the metal oxynitride of the present invention is used as an n-type thermoelectric conversion material.

The present invention affords the following effects.

(1) The thermoelectric conversion material comprising a metal oxynitride of the present invention is useful as a novel thermoelectric conversion material having negative thermoelectric power, low electric resistivity and low thermal conductivity, and having excellent heat-resistance, chemical durability and the like.

(2) On the basis of such characteristics, the metal oxynitride can be effectively used as an n-type thermoelectric conversion material for use in high temperatures, which was impossible for conventional intermetallic compounds.

(3) Thermal energy that had been wasted hitherto can be effectively utilized by building the metal oxynitride into a system, in the form of an n-type thermoelectric conversion material of a thermoelectric power generating module.

(4) The main constituent elements of the metal oxynitride are Ti, O and N, which are inexpensive and for which resources are plentiful, and hence the n-type thermoelectric conversion material can be supplied in large amounts and at a low cost.

(5) The metal oxynitride has a composition similar to that of substances having a photocatalytic effect, and hence is useful as a functional material that combines simultaneously a thermoelectric conversion effect and a photocatalytic effect.

DESCRIPTION OF THE PREFERRED EMBODIMENTS

The present invention is explained in detail below on the basis of examples, but it is in no way meant to be limited to or by them.

Example 1

Using titanium oxide ($TiO_2$) as a Ti source and O source, and titanium nitride (TiN) as a Ti source and N source, raw-material substances were weighed and thoroughly mixed to a total amount of 3 g and a composition ratio of Ti:O:N=1:1.8:0.09. The obtained powder was filled into a mold made of graphite having an outer diameter of 30 mm, an inner diameter of 10 mm and a height of 30 mm, and was subjected to electric current sintering under a pressure of 40 MPa. Sintering was carried out in a vacuum atmosphere of about 10 Pa, with heating up to 1200° C.

Figure 1:
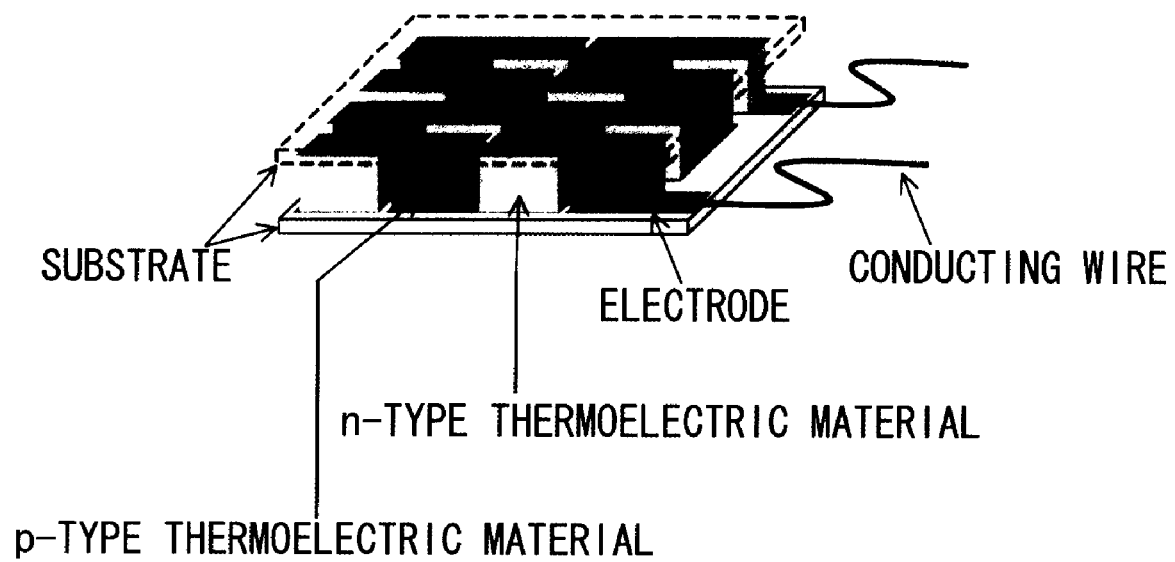
FIG. 1 is a diagram illustrating schematically a thermoelectric conversion element using as a thermoelectric conversion material the metal oxynitride of the present invention.
Figure 2:
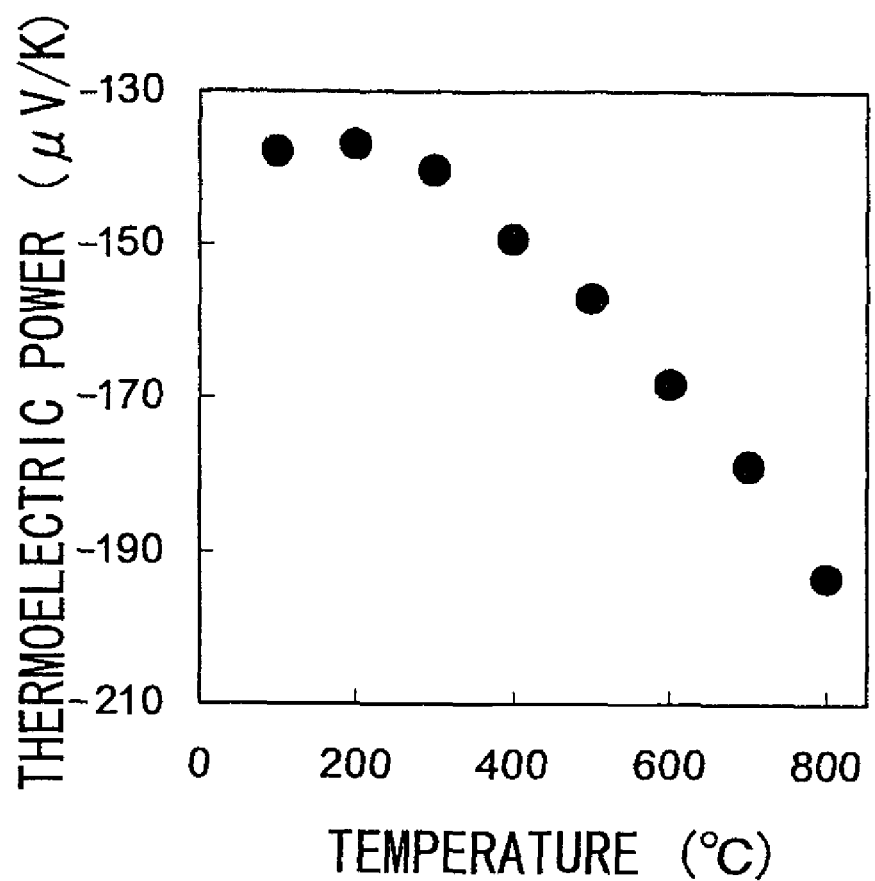
FIG. 2 is a graph illustrating the temperature dependency of the thermoelectric power of a metal oxynitride obtained in Example 1.

The obtained metal oxynitride was represented by the compositional formula: $TiO_{1.3}N_{0.05}$. FIG. 2 is a graph illustrating the temperature dependency of the thermoelectric power of the obtained metal oxynitride from 100° C. up to 800° C. FIG. 2 shows that the metal oxynitride has a negative thermoelectric power at temperatures of 500° C. and above, and that it is thus an n-type thermoelectric conversion material having low potential at the high-temperature side. All the other examples showed the same trend as Example 1, in that the metal oxynitride exhibited a high absolute value of the thermoelectric power, of 30 μV/K or more, at temperatures of 500° C. and above.

Figure 3:
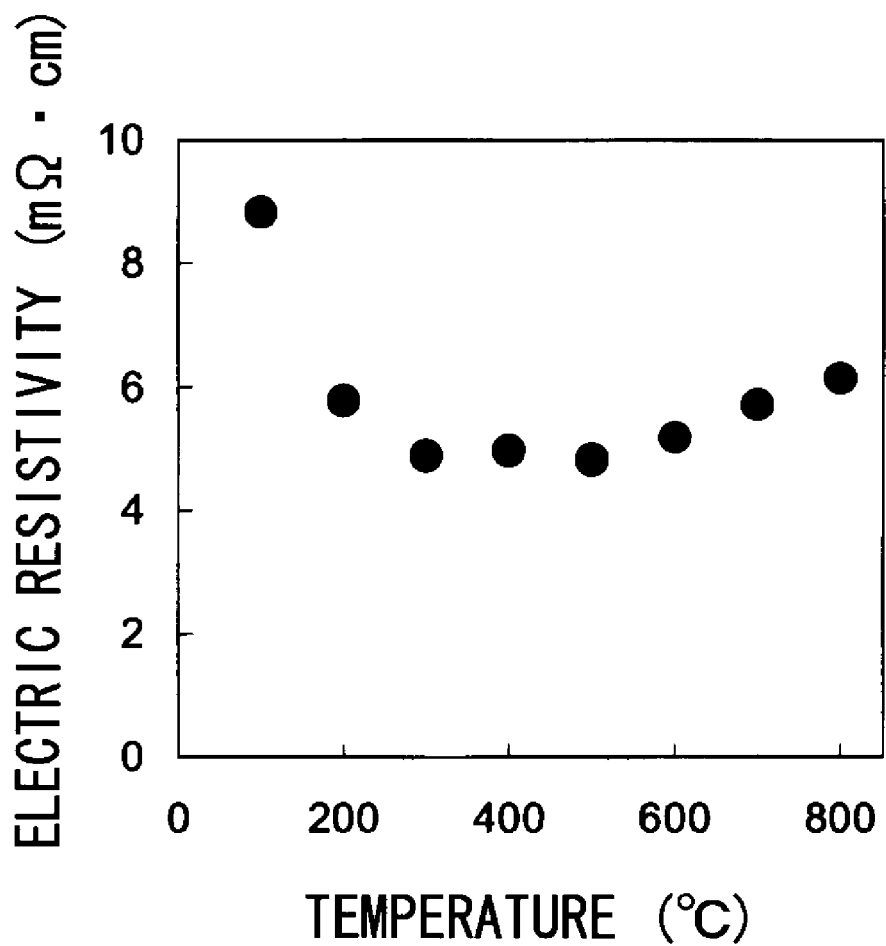
FIG. 3 is a graph illustrating the temperature dependency of the electric resistivity of the metal oxynitride obtained in Example 1.

FIG. 3 is a graph illustrating the temperature dependency of the electric resistivity of the metal oxynitride. As can be seen in FIG. 3, the metal oxynitride exhibited a low electric resistivity value, of 10 mΩ·cm or less, at temperatures of 500° C. and above. All the other examples showed the same trend as Example 1, in that the metal oxynitride exhibited a low electric resistivity value, of 10 mΩ·cm or less, at temperatures of 500° C. and above.

Figure 4:
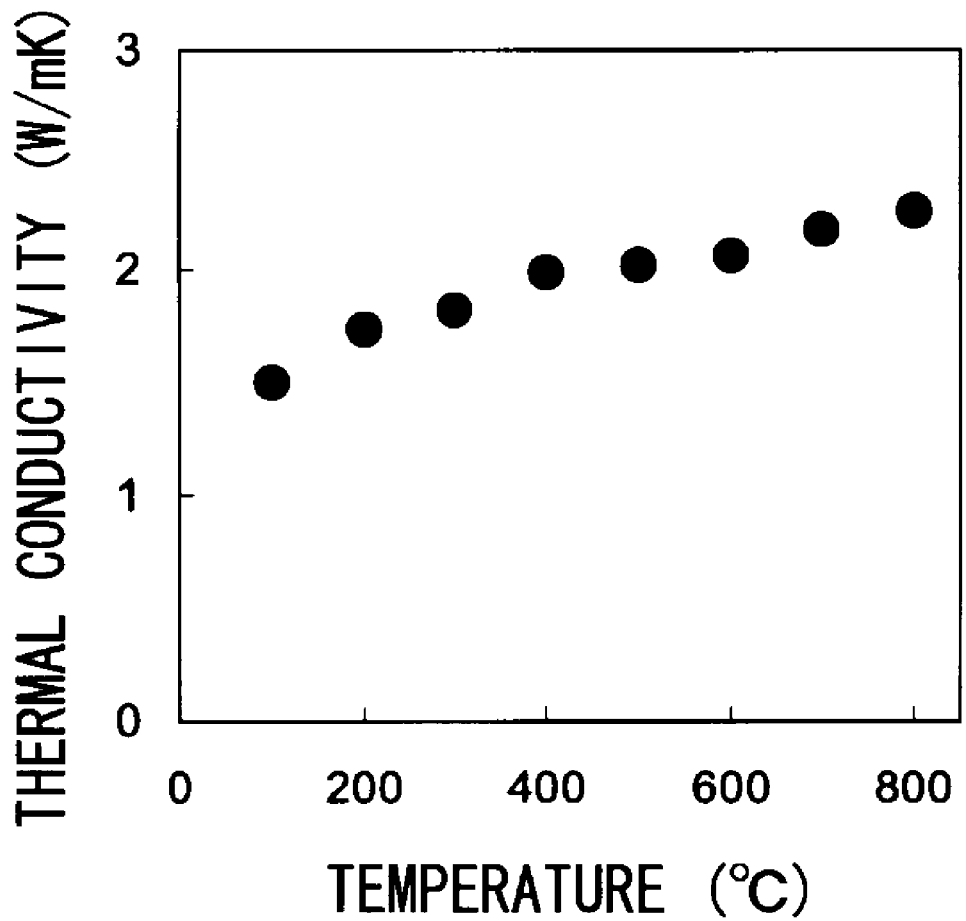
FIG. 4 is a graph illustrating the temperature dependency of the thermal conductivity of the metal oxynitride obtained in Example 1.

FIG. 4 is a graph illustrating the temperature dependency of the thermal conductivity of the metal oxynitride. As can be seen in FIG. 4, the metal oxynitride exhibited a low thermal conductivity value, of 10 W/mK or less, at temperatures of 500° C. and above. All the other examples showed the same trend as Example 1, in that the metal oxynitride exhibited a low thermal conductivity value, of 10 W/mK or less, at temperatures of 500° C. and above.

Examples 2 Through 7

Using titanium oxide ($TiO_2$) as a Ti source and O source, and titanium nitride (TiN) as a Ti source and N source, metal oxynitrides were synthesized to a total amount of 3 g in the same way as in Example 1 by mixing raw material substances with various element ratios. The sintering temperature was set to range between 1000 to 1400° C. in accordance with the target metal oxynitride. As illustrated in Table 1, the obtained metal oxynitrides had a compositional formula $TiO_yN_z$ wherein y varied between 0.5 and 2.0 and z varied between 0.01 to 0.6. Table 1 lists the element ratios, the thermoelectric power at 500° C., the electric resistivity at 500° C., and the thermal conductivity at 500° C. of the various metal oxynitrides.

TABLE 1

| Example | Composition ratio Ti:O:N | Thermoelectric power (μV/K) 500° C. | Electric resistivity (mΩ · cm) 500° C. | Thermal conductivity (W/mK) 500° C. |
|---|---|---|---|---|
| 1 | 1.0:1.4:0.05 | −160 | 4.8 | 2.0 |
| 2 | 1.0:1.8:0.01 | −210 | 8.3 | 2.4 |
| 3 | 1.0:1.3:0.11 | −130 | 3.0 | 2.7 |
| 4 | 1.0:1.2:0.17 | −110 | 1.8 | 3.3 |
| 5 | 1.0:1.1:0.23 | −75 | 1.2 | 3.6 |
| 6 | 1.0:1.0:0.25 | −65 | 0.9 | 3.8 |
| 7 | 1.0:0.86:0.44 | −45 | 0.75 | 5.0 |

Comparative Example 1

Using titanium oxynitride ($TiO_2N_{0.01}$) as a Ti source, O source and N source, a metal oxynitride was synthesized in the same way as in Example 1, to a total amount of 3 g, except that herein the sintering temperature was 1000° C. The obtained metal oxynitride was represented by compositional formula $TiO_{2.0}N_{0.004}$. The obtained metal oxynitride exhibited a negative thermoelectric power having an extremely high absolute value, of 700 μV/K, at 500° C. However, the electric resistivity of the metal oxynitride at 500° C. was likewise very high, of 1500 mΩ·cm, which made the metal oxynitride unsuitable as a thermoelectric conversion material.

Comparative Example 2

Using titanium oxynitride ($TiO_{0.02}N$) as a Ti source, O source and N source, a metal oxynitride was synthesized in the same way as in Example 1, to a total amount of 3 g, except that herein the sintering temperature was 1400° C. The obtained metal oxynitride was represented by compositional formula $Ti_{0.01}N_{0.99}$. The obtained metal oxynitride exhibited a negative thermoelectric power having an extremely low absolute value, of 10 ·V/K, at 500° C., which made the metal oxynitride unsuitable as a thermoelectric conversion material.

Figure 5:
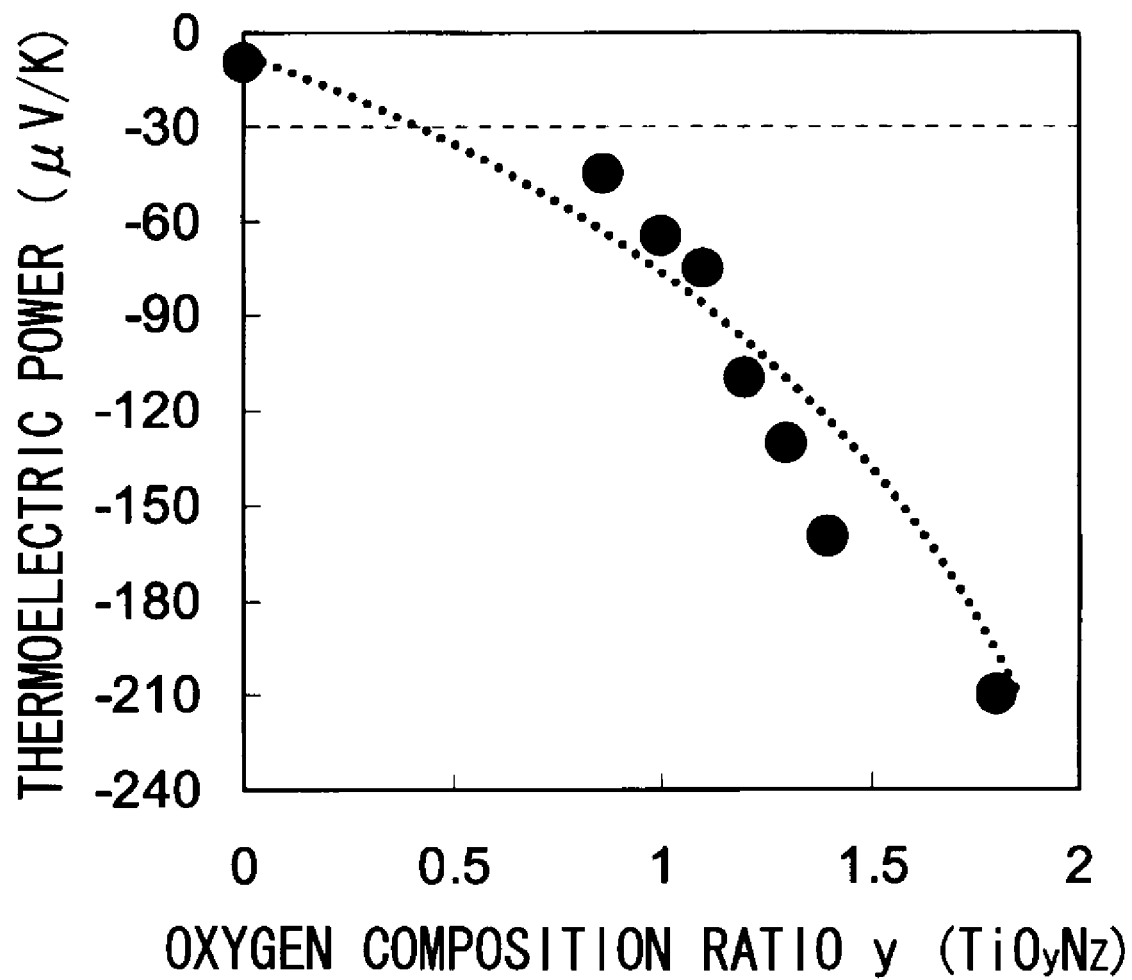
FIG. 5 illustrates the relationship between thermoelectric power and the oxygen composition ratios obtained in Examples 1 through 7 and Comparative example 2.
Figure 6:
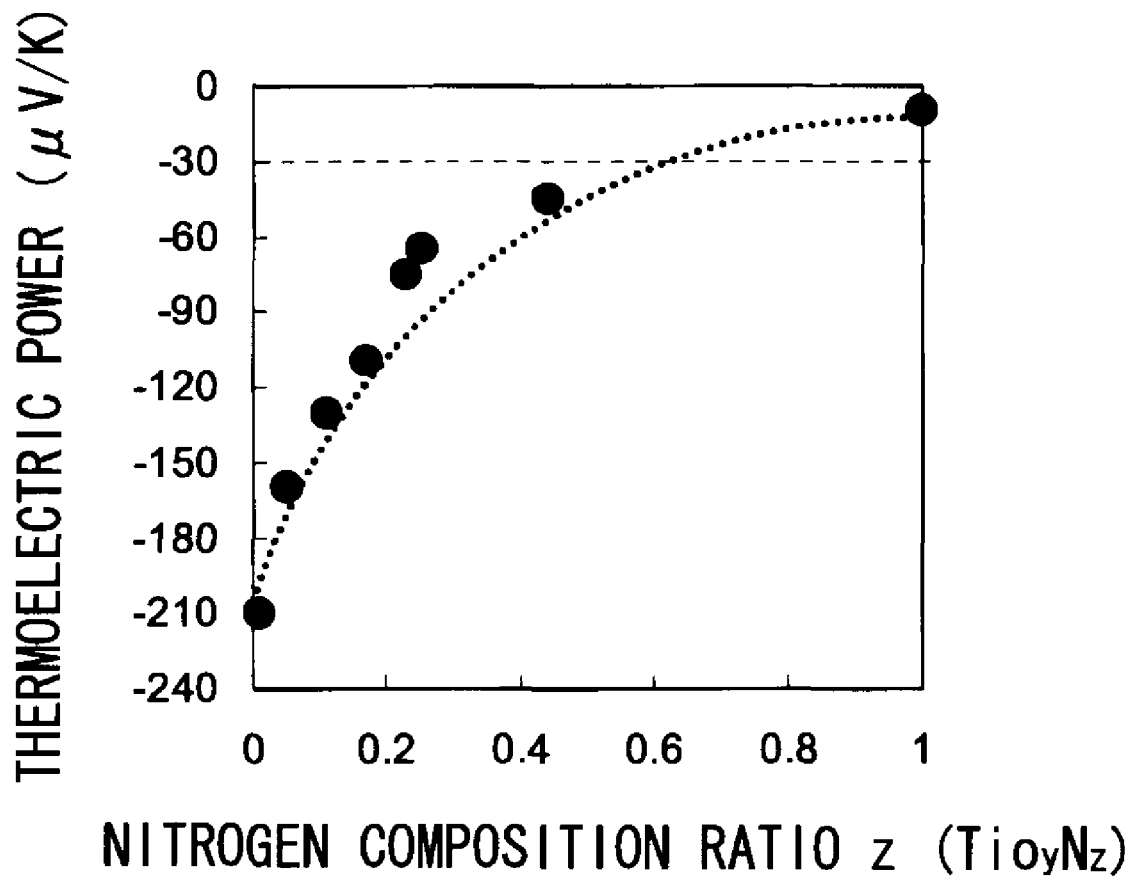
FIG. 6 illustrates the relationship between thermoelectric power and the nitrogen composition ratios obtained in Examples 1 through 7 and Comparative example 2.

FIG. 5 illustrates the relationship between thermoelectric power and the oxygen composition ratios obtained in Examples 1 through 7 and Comparative example 2. This relationship indicates that a sufficiently large thermoelectric power cannot be obtained when the oxygen composition ratio is lower than 0.5. FIG. 6 illustrates the relationship between thermoelectric power and the nitrogen composition ratios obtained in Examples 1 through 7 and Comparative example 2. This relationship indicates that a sufficiently large thermoelectric power cannot be obtained when the nitrogen composition ratio is higher than 0.6.

As explained above, the present invention relates to a metal oxynitride thermoelectric conversion material having superior thermoelectric conversion performance. The present invention allows providing a thermoelectric conversion material having negative thermoelectric power, low electric resistivity and low thermal conductivity, and exhibiting superior thermal resistance, chemical durability and the like. Also, the present invention allows providing an n-type thermoelectric conversion element comprising the metal oxynitride, as well as a thermoelectric power generating module in which such n-type thermoelectric conversion element is built into a system.

What is claimed is:

1. A thermoelectric conversion element, comprising:
   a metal oxynitride having a composition represented by formula $Ti_{1-x}A_xO_yN_z$ and having other inevitable elements of impurities, wherein
   A is at least one element selected from the group consisting of transition metals of the 4th and 5th periods of the periodic table,
   $0<x\leq0.5$,
   $0.5\leq y\leq2.0$,
   $0.01\leq z\leq0.6$, and
   wherein the thermoelectric conversion element has a high-temperature portion and a low-temperature portion.

2. The thermoelectric conversion element as claimed in claim 1, wherein A in the formula is at least one element selected from the group consisting of V, Cr, Mn, Fe, Co, Ni, Zr and Nb.

3. The thermoelectric conversion element as claimed in claim 1, having an absolute value of thermoelectric power of at least 30 μV/K at 500° C. or above.

4. The thermoelectric conversion element as claimed in claim 1, having an electric resistivity of 10 mΩ·cm or less at 500° C. or above.

5. The thermoelectric conversion element as claimed in claim 1, having a thermal conductivity of 10 W/mK or less at 500° C. or above.

6. The thermoelectric conversion element as claimed in claim 1, wherein the metal oxynitride is a polycrystal body.

7. The thermoelectric conversion element as claimed in claim 1, wherein the thermoelectric conversion element is an n-type thermoelectric conversion element.

* * * * *